United States Patent [19]

Walker

[11] Patent Number: 5,066,245

[45] Date of Patent: Nov. 19, 1991

[54] RETENTION DEVICE FOR FLAT PACK SOCKETS

[75] Inventor: Kevin E. Walker, Harrisburg, Pa.

[73] Assignee: AMP Incorporated, Harrisburg, Pa.

[21] Appl. No.: 611,247

[22] Filed: Nov. 9, 1990

[51] Int. Cl.⁵ ............................................. H05K 1/00
[52] U.S. Cl. .................................. 439/526; 206/328; 206/329; 206/331; 439/70; 439/330
[58] Field of Search .................. 439/70, 73, 68, 330, 439/331, 526; 206/328, 329, 331

[56] References Cited

U.S. PATENT DOCUMENTS

| | | | |
|---|---|---|---|
| 4,718,548 | 1/1988 | Estrada et al. | 206/329 |
| 4,872,845 | 10/1989 | Korsunsky et al. | 439/70 |
| 4,881,639 | 11/1989 | Matsuoka et al. | 206/328 |
| 4,936,783 | 6/1990 | Petersen | 439/526 |
| 4,991,714 | 2/1991 | Clatanoff | 206/331 |

Primary Examiner—Paula A. Bradley
Attorney, Agent, or Firm—Allan B. Osborne

[57] ABSTRACT

A retention device (10) for retaining a bumperless plastic quad flat pack (80) in a socket cover (12) is disclosed. The device (10) includes an engaging member (54) at the end of a resilient arm (50) and which has a slanted surface (66) which engages a slanted surface (94) of a reverse orientation on the flat pack (80) to urge it in a direction against the restraining force of the leads (104) of the pack (80), which are received in slots (32) in the cover side walls (26).

8 Claims, 5 Drawing Sheets

RETENTION DEVICE FOR FLAT PACK SOCKETS

FIELD OF THE INVENTION

The invention disclosed herein is to a retention device for retaining bumperless plastic quad flat pack chip carriers in an electrical socket cover.

BACKGROUND OF THE INVENTION

U.S. Pat. No. 4,872,845, which is incorporated herein by reference, discloses a chip carrier socket and cover for retaining a plastic quad flat pack having bumpers extending outwardly from each corner thereof. The flat pack is retained in the cover by the bumpers engaging resilient U-shaped arms, the ends of which are attached to the adjacent side walls of the cover. Flat pack manufacturers have now introduced a flat pack having no bumpers. Accordingly, it is necessary to provide a retention device in the cover of the socket to retain these new bumperless flat packs.

SUMMARY OF THE INVENTION

According to the invention, retaining devices for retaining a bumperless plastic quad flat pack in a socket cover is provided. The devices include a resilient arm attached to a cover side wall and extending into an opening through the cover in which the flat pack is received. An engaging member on the resilient arm includes a flat slanted surface of one orientation to engage a flat slanted surface of an opposite orientation to urge the flat pack against the restraining forces of the end portion of the flat pack lead which are received in slots in the base of the cover's side walls.

DESCRIPTION OF THE INVENTION

Figure 5:
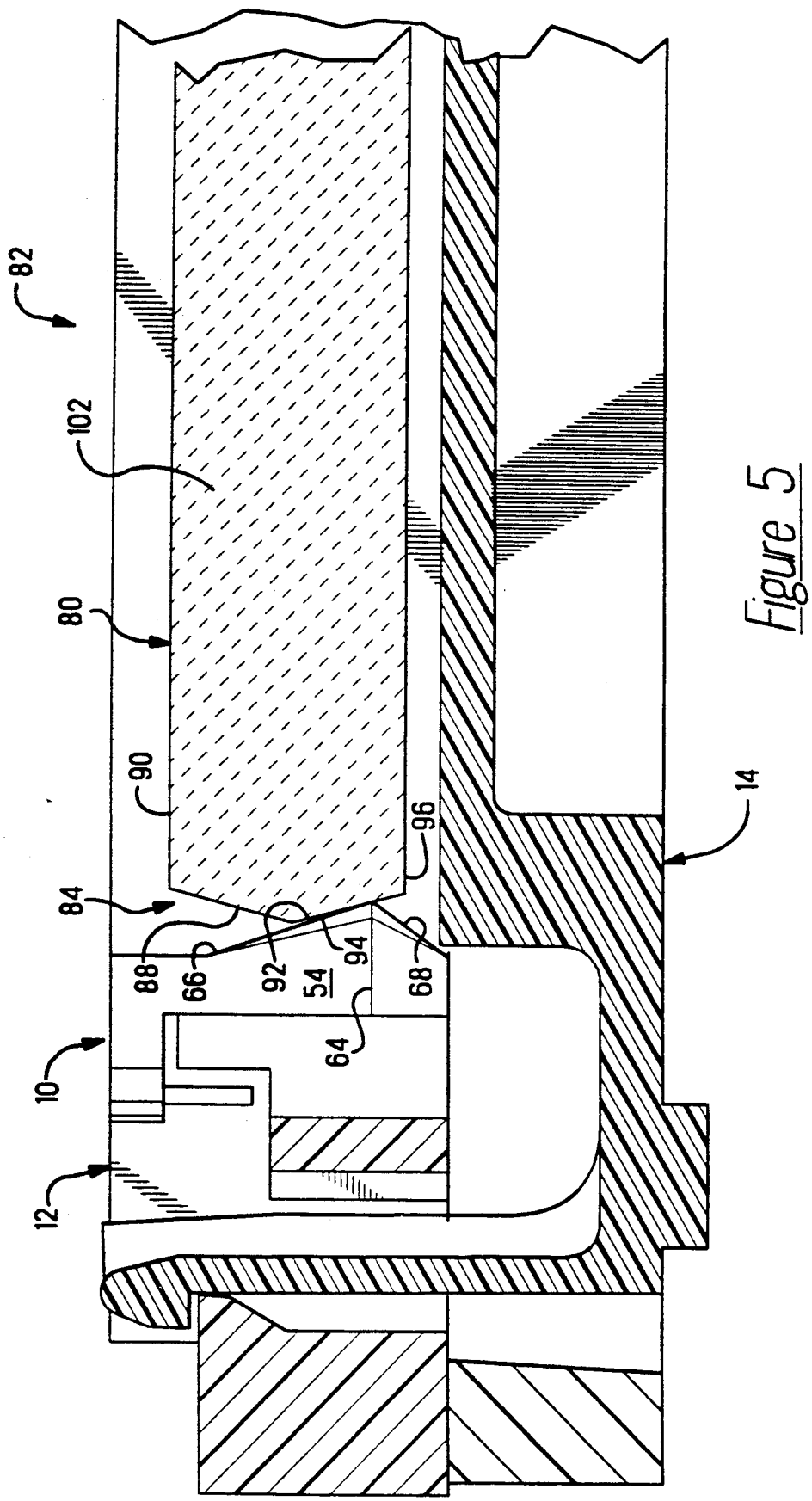
FIG. 5 is a side sectioned view of the cover and retained flat pack assembled to a socket body.

The invention described herein relates to a retention device, indicated by reference numeral 10 throughout the several drawing figures, in a cover 12 for use with a socket body 14 (FIG. 5). Socket body 14, including the terminals (not shown) therein, has been fully described in U.S. Pat. No. 4,872,845 (incorporated herein by reference) and will not be described herein.

Figure 1:
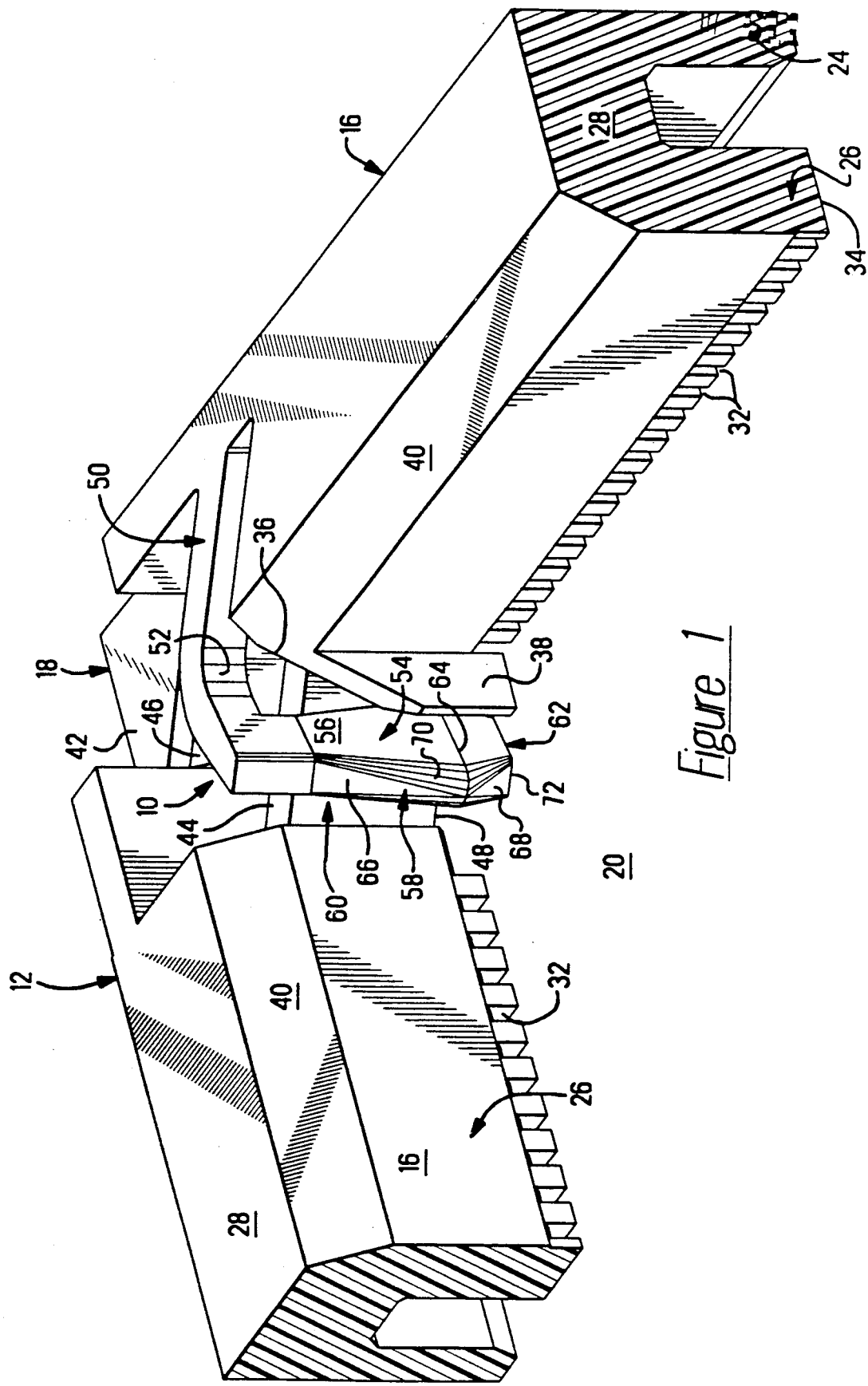
FIG. 1 is a perspective view of one corner of a cover for a socket illustrating the retention device of the present invention.
Figure 2:
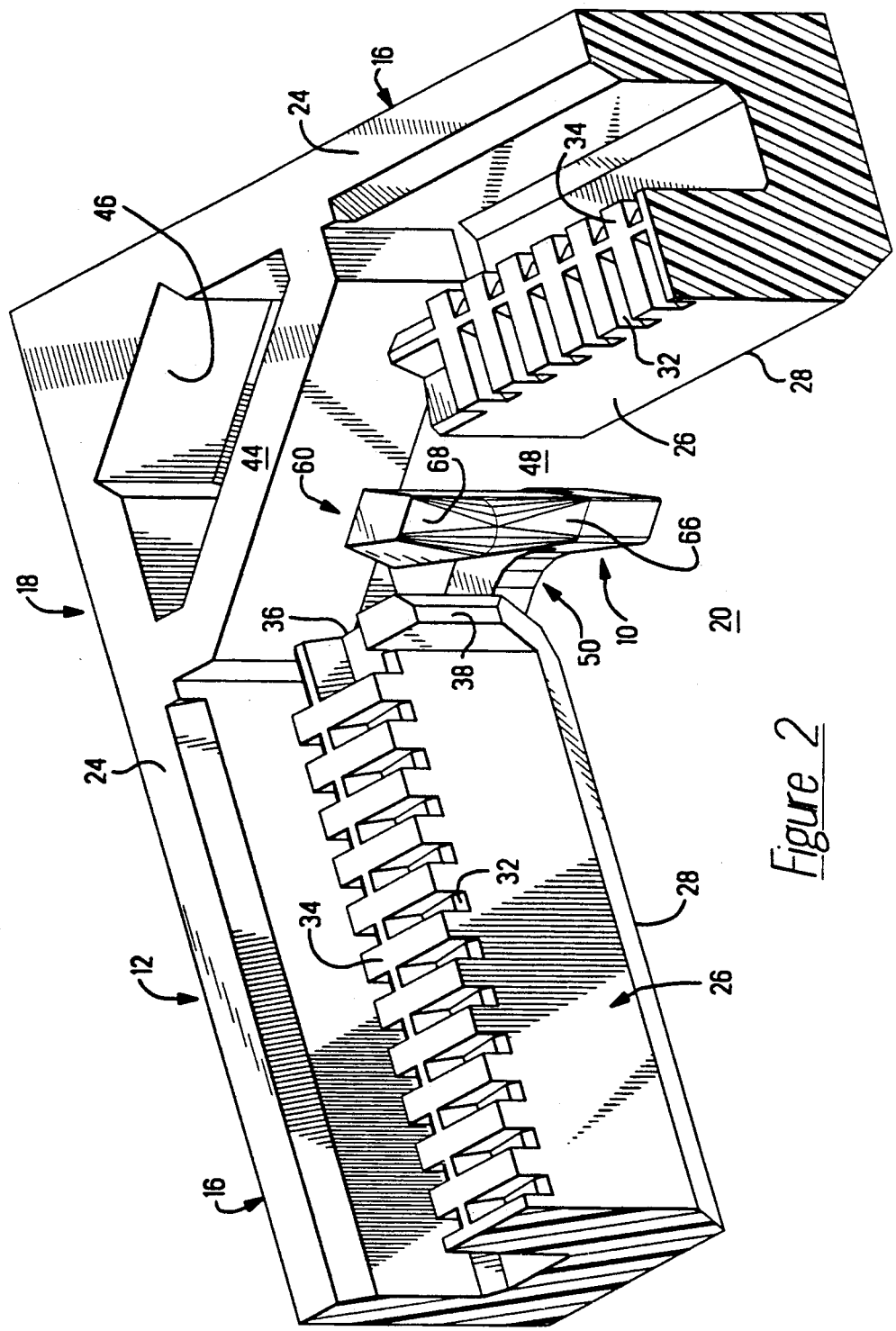
FIG. 2 is a perspective view of the one corner of the cover taken from below.

With reference to FIGS. 1 and 2, cover 12 is frame-shaped and includes U-shaped side walls 16 and corner 18, all of which define a central, flat pack receiving recess or opening 20.

Side walls 16 include outer wall 24, inner wall 26 and top surface 28 spanning and joining the two walls 24,26.

Lead-receiving slots 32 are provided along the base 34 of inner wall 26 and at each end 36 of two facing inner walls 26 (FIG. 3), protrusions 38 are provided for purposes noted below. Further, chamfers 40 are provided along the top edge of each inner wall 26.

Figure 3:
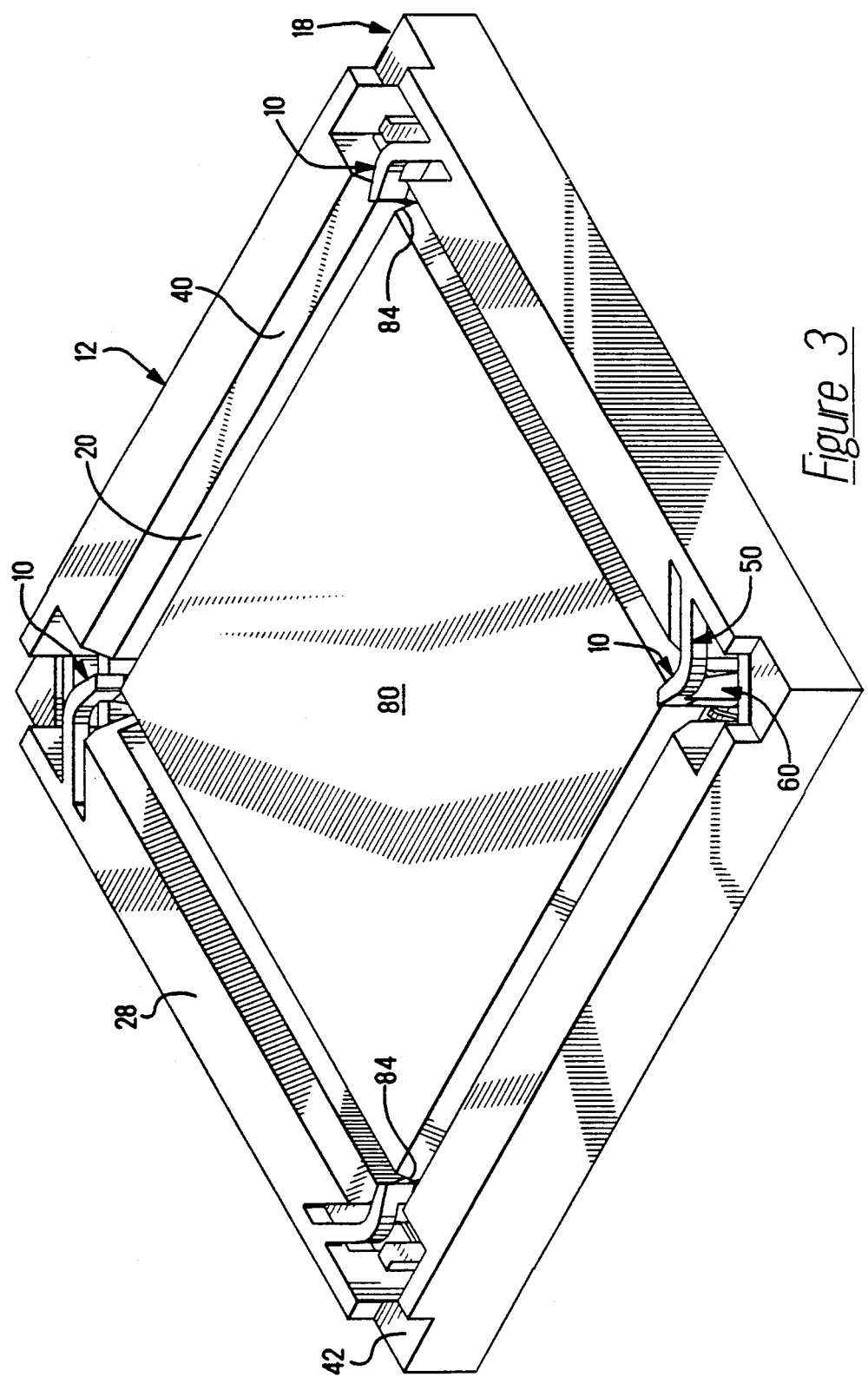
FIG. 3 is a perspective view showing a bumperless plastic quad flat pack inserted into the cover.

Corner 18 includes intersecting outer walls 24 having a top surface 42 which is stepped down relative to top surface 28. FIG. 3 shows this particularly well. In addition, an interior wall 44 spans the space between adjacent walls 24 and is spaced inwardly to define a latch arm opening 46.

As shown in FIGS. 1 and 2, inner walls 26 terminate near each corner to provide space 48 therebetween.

Retention device 10 includes a resilient arm 50 which is attached to an inside surface of wall 24 which includes a curved portion 52 so that it curves through adjacent inner walls 26 and into opening 20. Device 10 further includes an engaging member 54 which is attached to arm 50 and extends perpendicularly therefrom. Member 54 includes parallel sides 56 and a front surface 58 which faces opening 20. Front surface 58 is subdivided into upper section 60 and lower section 62 with dividing line 64 therebetween. Both sections 60,62 include a triangular-shaped flat portion 66,68 respectively with the apexes meeting at dividing line 64. Rounded portions 70 provide a transition between flat portions 66,68 and sides 56.

Upper section 60 is slanted outwardly or into opening 20 from its attachment to arm 50 and lower section 62 is slanted outwardly from free end 72 up to dividing line 64. As shown, section 60 is longer than section 62.

Figure 4:
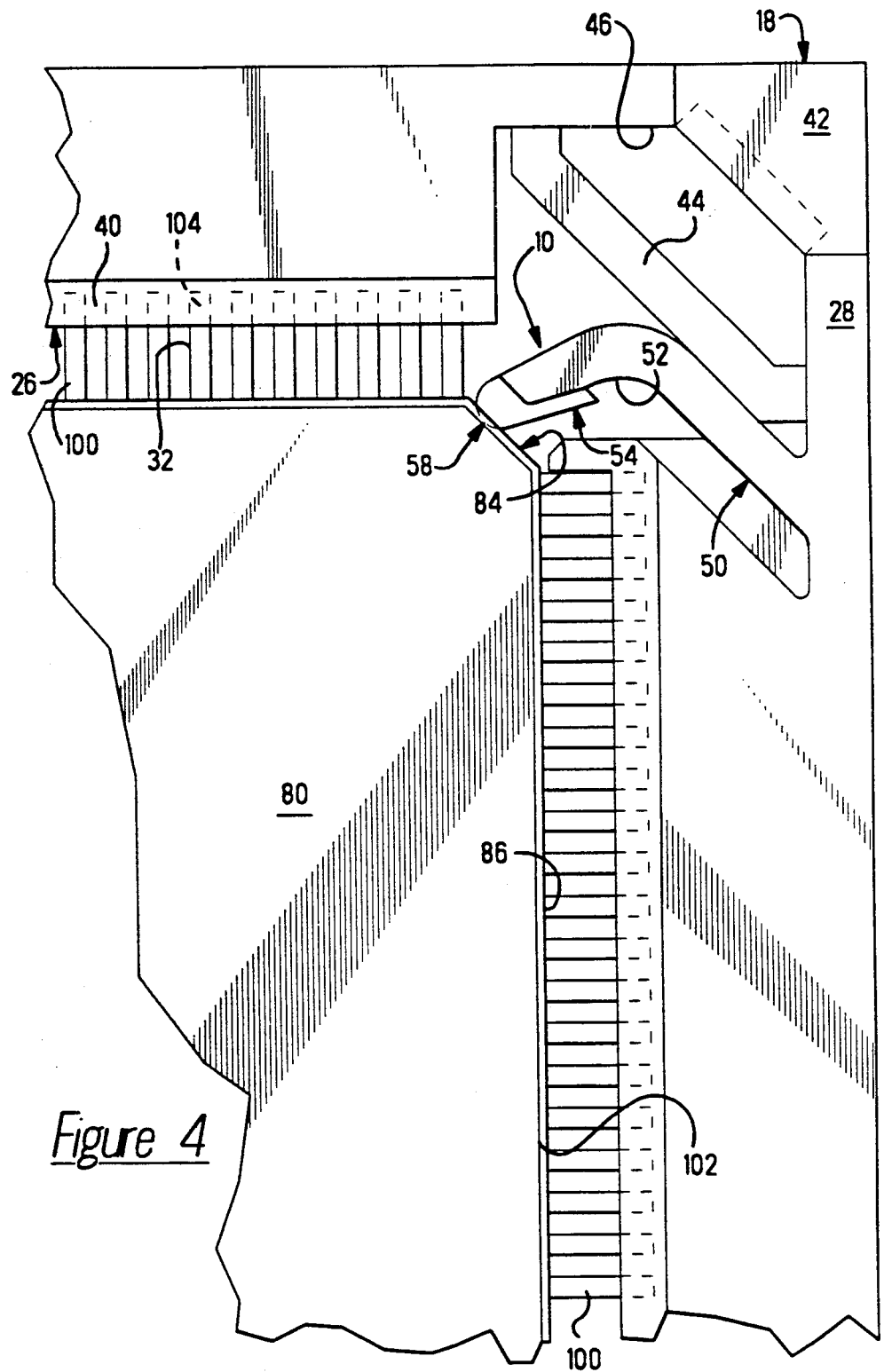
FIG. 4 is a top plan view of one corner of the cover with the flat pack inserted therein.

FIGS. 3, 4 and 5 show a bumperless plastic quad flat pack 80 positioned in opening 20 of cover 12 and in the latter figure, cover 12 latched to socket body 14 to form socket 82.

As shown in FIG. 3, corners 84 of the flat pack 80 illustrated are square and in FIG. 4, corners 84 are beveled between adjacent side walls 86. These differences represent construction preferences by the several flat pack manufacturers and further the drawings support the fact that retention devices are usable with flat packs of differing construction. Further, as shown in FIG. 5, corners 84 (as well as side walls 86) in the vertical plane are subdivided into an upper section 88 which slopes obliquely outwardly from top surface 90 to a central point 92 and a lower section 94 which slopes inwardly from central point 92 to base surface 96.

Flat pack 80 further includes a plurality of lead 100 as shown in FIG. 4. Leads 100 extend outwardly from pack body 102 along the aforementioned central point 92, are bent downwardly towards base surface 96 and then bent about ninety degrees outwardly to provide end portions 104.

Flat pack 80 is inserted into opening 20 from below. Retention devices 10 are resiliently cammed back into spaces 48 by the upper sections 88 on corners 84 engages flat surfaces 68 on members 54. As the central point 92 passes dividing line 64, devices 10 move back into opening 20 and lower section 94 on corners 84 engage flat surfaces 66 on members 54. Upward movement is arrested by end portions 104 of pack leads 100 being received in slots 32 in base 34 of inner walls 26 (FIG. 4). However, devices 10 continue to urge pack 80 upwardly to retain it in cover 12.

As shown in FIG. 4, interior walls 44 provide a stop for retention devices 10 to prevent the over-stressing thereof.

Pack 80 is easily removed from cover 12 by pressing downwardly on it to force devices 10 back into spaces 48.

As noted above, protrusions 38 are provided at the ends 36 of two facing inner walls 26. These protrusions 38 provide initial orientation and alignment of leads 100 into slots 32 and also prevents pack 80 from being twisted.

Chamfers 40 on inner walls 26 permits visual observation of leads 100 alignment with slots 32 and further, provides an opening for test probes (not shown) for debugging the flat pack 80 retained in cover 12.

Retention devices 10 can, of course, be easily modified to be used in covers receiving other types of flat packs and electronic devices. Accordingly, the scope of the appended claims should not be interpreted to the limited use of bumperless plastic quad flat packs.

As can be discerned, a retention device for retaining bumperless plastic quad flat packs in a socket cover has been disclosed. The devices include a resilient arm attached to a cover wall and extending into a pack-receiving opening in the cover. An engaging member attached to the resilient arm includes slanted flat surfaces which engage oppositely orientated slanted flat surfaces on the pack to provide a continuing pressure thereagainst. End portions on the leads extending outwardly from the pack, received in slots in the cover walls, counter that pressure so that the pack is retained in the cover.

I claim:

1. A retention device for retaining bumperless plastic quad flat packs in a frame-shaped socket cover of the type having slots in the base for receiving end portions of leads extending outwardly from the pack, the retention device comprising:
   a resilient arm attached to a cover wall adjacent each corner and extending into an opening into which a flat pack may be received; and
   an engaging member attached to and extending perpendicular from an end of said arm and having a flat surface facing in and slanted outwardly, said flat surface adapted to engage a flat surface of a reversed slanted orientation on the flat pack to urge the flat pack outwardly against the restraining force of the end portions in the slots.

2. The retention device of claim 1 wherein said resilient arm includes a curved portion.

3. An electrical socket cover for electronic devices, said cover comprising:
   side walls defining a central opening for receiving an electronic device;
   slots in the base of said side walls for receiving end portions of leads extending outwardly from the electronic device;
   a resilient arm attached to a side wall at each corner and extending into said central opening; and
   an engaging member attached to and extending perpendicular from an end of said arm and having a surface facing obliquely outwardly and adapted to engage a surface on the electronic device to urge the device outwardly of said central opening.

4. The cover of claim 3 further including spaced apart protrusions on two facing side walls for guiding the electronic device.

5. The cover of claim 3 wherein said side walls include chamfer edges on a side facing said central opening.

6. The cover of claim 3 further including means adjacent said resilient arm for preventing said arm from being over-stressed.

7. The cover of claim 6 wherein said resilient arm includes a curved portion between said side wall and said engaging member.

8. The cover of claim 7 wherein said resilient arm is attached to said side wall at an oblique angle relative thereto.

* * * * *